United States Patent
Lin

(10) Patent No.: US 9,612,630 B2
(45) Date of Patent: Apr. 4, 2017

(54) FLASH DRIVE

(71) Applicant: PHISON ELECTRONICS CORP., Miaoli (TW)

(72) Inventor: Wei-Hung Lin, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 50 days.

(21) Appl. No.: 14/742,664

(22) Filed: Jun. 17, 2015

(65) Prior Publication Data

US 2016/0306398 A1 Oct. 20, 2016

(30) Foreign Application Priority Data

Apr. 17, 2015 (TW) .............................. 104205868 U

(51) Int. Cl.
| | |
|---|---|
| *G06F 1/16* | (2006.01) |
| *H05K 5/00* | (2006.01) |
| *H05K 7/00* | (2006.01) |
| *G06F 1/18* | (2006.01) |

(52) U.S. Cl.
CPC .................... *G06F 1/181* (2013.01)

(58) Field of Classification Search
CPC ................................. G06F 1/181; G06F 1/183
USPC ............ 361/679.41, 679.31, 679.32, 679.45
See application file for complete search history.

(56) References Cited

U.S. PATENT DOCUMENTS

| 7,787,243 B2 * | 8/2010 | Salazar ................. G06F 13/378 361/679.31 |
| 2013/0114201 A1 * | 5/2013 | Huang ................... G06F 1/1613 361/679.32 |

\* cited by examiner

*Primary Examiner* — Anthony Haughton
(74) *Attorney, Agent, or Firm* — Jianq Chyun IP Office

(57) ABSTRACT

A flash drive including a housing, a carrier, and a storage module is provided. The carrier is movably disposed inside the housing along a first axis. The carrier has an elastic arm being deformable along a second axis. The storage module is assembled to the carrier to move together with the carrier in relative to the housing, so that a connector of the storage module is moved outside the housing or hidden inside the housing. The elastic arm has a contour protruded along a direction away from the storage module when not receiving force.

13 Claims, 7 Drawing Sheets

FLASH DRIVE

CROSS-REFERENCE TO RELATED APPLICATION

This application claims the priority benefit of Taiwan application serial no. 104205868, filed on Apr. 17, 2015. The entirety of the above-mentioned patent application is hereby incorporated by reference herein and made a part of this specification.

BACKGROUND

Technical Field

The invention relates to a flash drive.

Description of Related Art

With the developments of multimedia technology, storage capacity required for digital data goes larger and larger. Although a conventional hard disk provides a large storage capacity, it still suffers in bulk size which leads to inconvenient carrying. Recently, with the popularization of the universal serial bus (USB) interface and the reduction of the price of the flash memory, USB flash disks advantaged in large storage capacity, high compatibility and portability are broadly applied in data transmission between various computers and storage devices.

Because the flash drive is electrically connected to a peripheral device (e.g., a computer host and a storage device) through a connector (e.g., a USB plug or a IEEE 1394 plug) of a storage module (e.g., aforesaid memory), which is movably assembled inside a housing so that the connector may be moved outside the housing to accomplish the purpose of connecting with the peripheral device. However, during the process of moving the connector outside the housing to be connected to the peripheral device, the connector is often pushed back inside the housing by a reaction force generated when connecting to the peripheral device due to poor design or unstable state of the structure. Accordingly, it is an issue for manufacturers of the flash drive as how to successfully moving the storage module in the housing while providing a stable positioning effect.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a flash drive, which includes a carrier having an elastic arm protruded in the direction away from a storage module, so as to improve a structural strength for moving and positioning inside a housing.

A flash drive of the invention includes a housing, a carrier, and a storage module. The carrier is movably disposed inside the housing along a first axis. The carrier has an elastic arm, and the elastic arm is deformable along a second axis. The storage module is assembled to the carrier to move together with the carrier in relative to the housing, so that a connector of the storage module is moved outside the housing or hidden inside the housing. The elastic arm has a contour protruded along a direction away from the storage module when not receiving force.

Based on the above, in the embodiments of the invention, the carrier configured to carry the storage module has the elastic arm protruded in the direction away from the storage module to be pressed against by the housing to generate the elastic force in order to increase the interference force between the carrier and the housing. As a result, the engaging point on the carrier and the engaging slot on the housing may be engaged to each other more stably, and the structural strength of the elastic arm may also be increased by its own protruding contour, so as to prevent the condition where the bending deformation towards the storage module from occurring due to pressing by users.

In order to make the aforementioned and other features and advantages of the present invention more comprehensible, several embodiments accompanied with figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
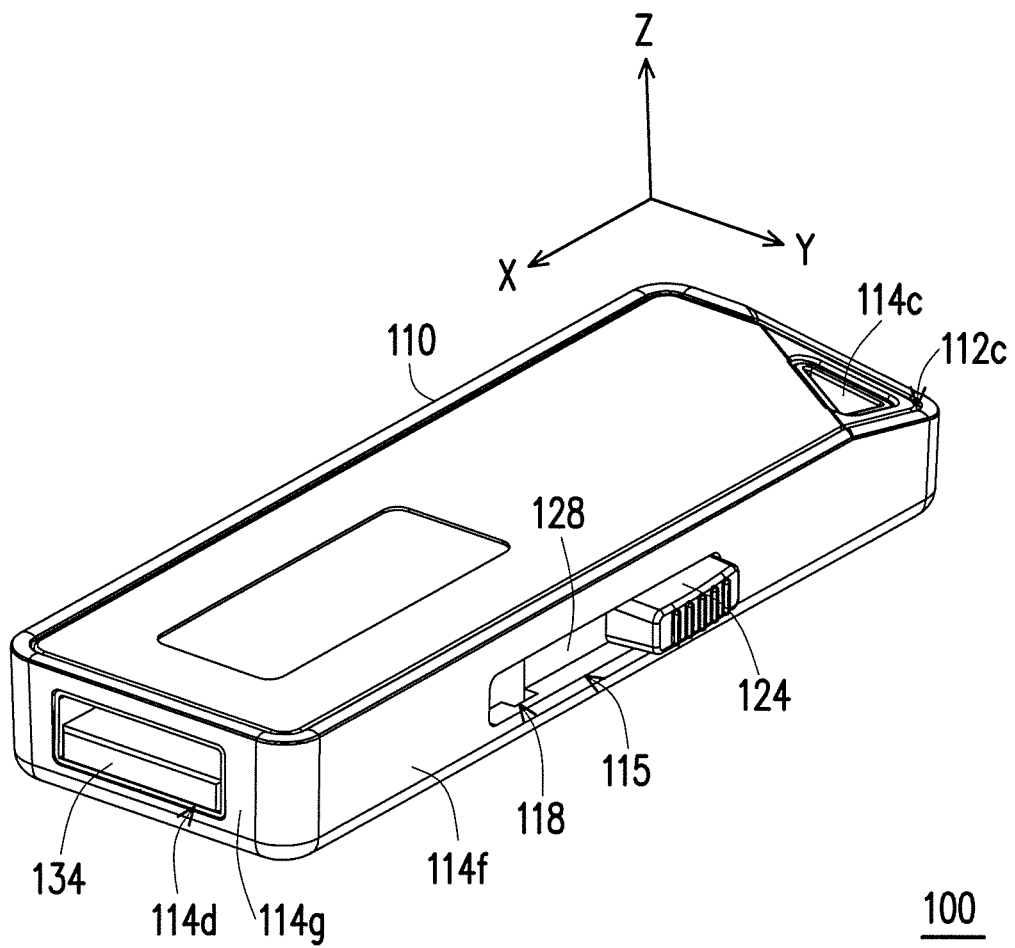
FIG. 1 is a schematic diagram illustrating a flash drive according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
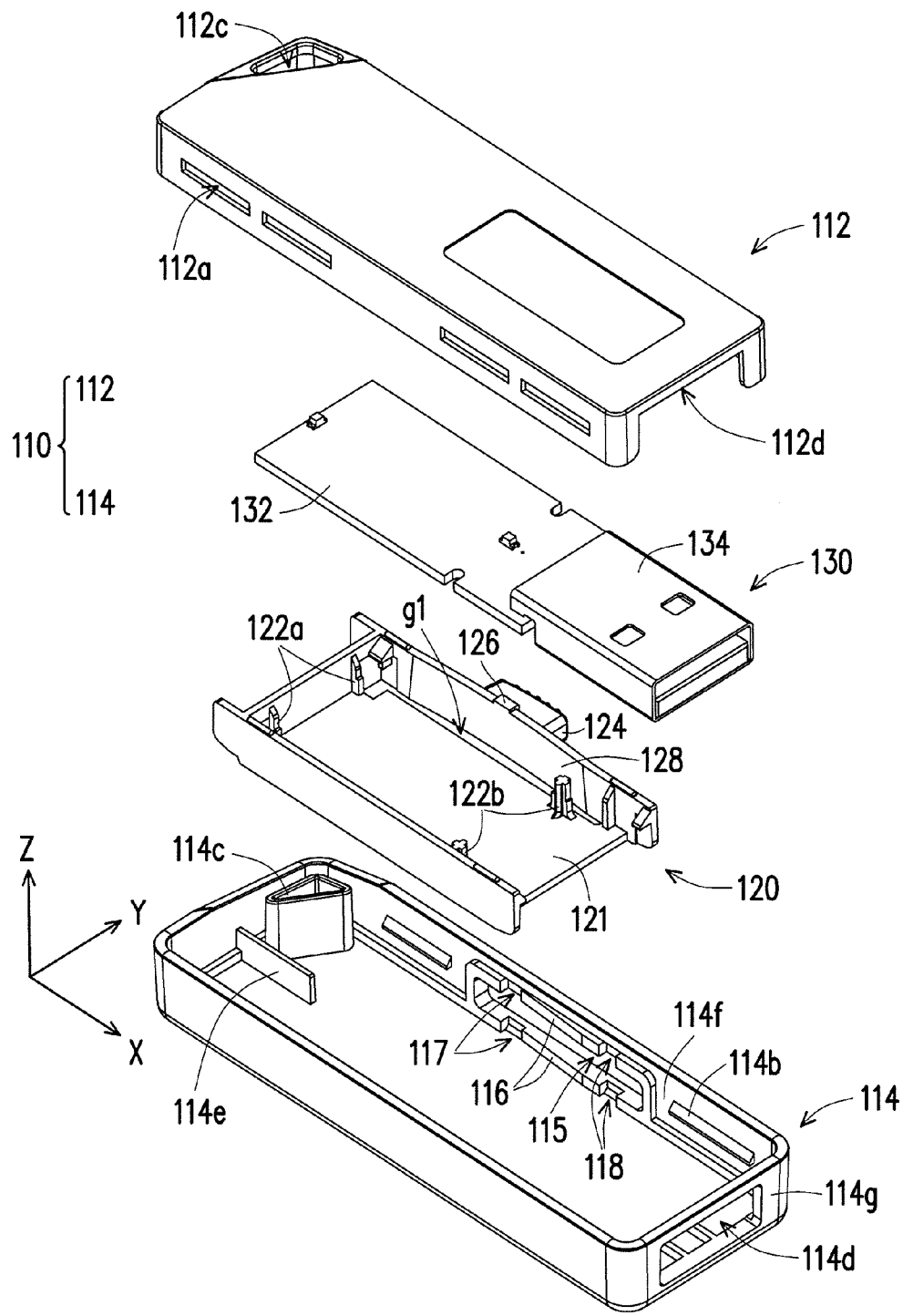
FIG. 2 and FIG. 3 are explosion diagrams of the flash drive of FIG. 1 respectively illustrated by different perspectives.
Figure 3:
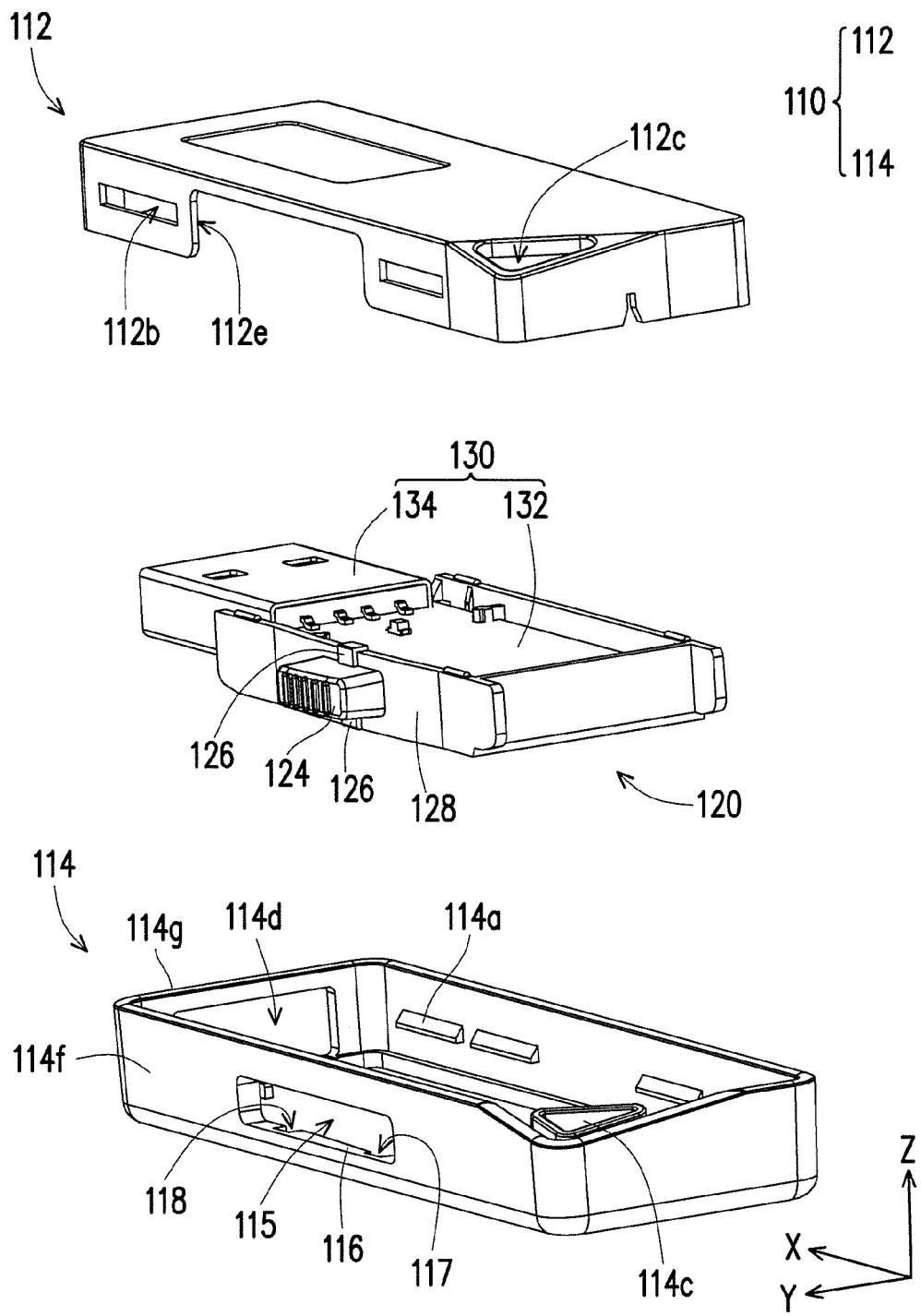

FIG. 1 is a schematic diagram illustrating a flash drive according to an embodiment of the invention. FIG. 2 and FIG. 3 are explosion diagrams of the flash drive of FIG. 1 respectively illustrated by different perspectives, wherein specific components of FIG. 2 are combined together in FIG. 3. Meanwhile, a rectangular coordinate system is provided in the drawings to facilitate subsequent descriptions for the related components.

Referring to FIG. 1 to FIG. 3, in the present embodiment, a flash drive 100 includes a housing 110, a carrier 120 and a storage module 130. The housing 110 is composed of a first part 112 and a second part 114. Herein, the first part 112 has a plurality of openings (112a, 112b) in stripe shape located on two sides of the first part (only one of which is illustrated in the drawing). The second part 114 has a plurality of ribs (114a, 114b) in stripe shape located on two sides of the second part (only one of which is illustrated in the drawing), such that the openings (112a, 112b) and the ribs (114a, 114b) may be engaged to each other when the first part 112 is combined with the second part 114, so as to secure the first part 112 and the second part 114 together. Furthermore, the second part 114 further includes an opening 114d in lateral direction and a pillar 144c located on the opposite side, whereas the first part 112 further includes a recess 112d and an opening 112c located on the opposite side. When the first part 112 is combined with the second part 114, the recess 112d is closely adjacent to and in contact with a periphery of the opening 114d, whereas the pillar 114c is inserted into the opening 112c to be positioned each other and forming a space for accommodating the carrier 120 and the storage module 130. Meanwhile, the recess 112e on the same side of the opening 112b is engaged with the rib near the opening 115 to serve as a part of structure combined by the first part 112 and the second part 114.

Referring back to FIG. 2 and FIG. 3, the carrier 120 is movably disposed inside the housing 110 along a X-axis, and the carrier 120 has an elastic arm 128 deformable along a Y-axis. The storage module 130 is assembled to the carrier 120 to move together with the carrier 120 in relative to the housing 110 (along the X-axis), so that a connector 134 of the storage module 130 is moved outside the housing 110 for connecting with the peripheral device, or hidden inside the housing 110 for storage, through the opening 114d. Herein, the storage module 130 is, for example, served as a connection interface for connecting to the peripheral device, which is made by packaging elements like the memory (not illustrated) on a circuit board 132 followed by soldering the connector 134 on one side of the circuit board 132. However, types of the storage module 130 and the connector 134 thereof are not limited in the present embodiment. In another embodiment that is not illustrated, the storage module 120 is, for example, a system in package (SIP) module (i.e., a package module formed by a package having one chip or multiple chips together with any additional elements including a passive element, a capacitor, a resistor, a connecting interface, an antenna, etc.) which uses the connector as the connection interface electrically connected with the peripheral device. The connector may be the universal serial bus (USB) connector in the foregoing embodiment, or other known connectors in prior art, such as a micro-USB.

Figure 4:
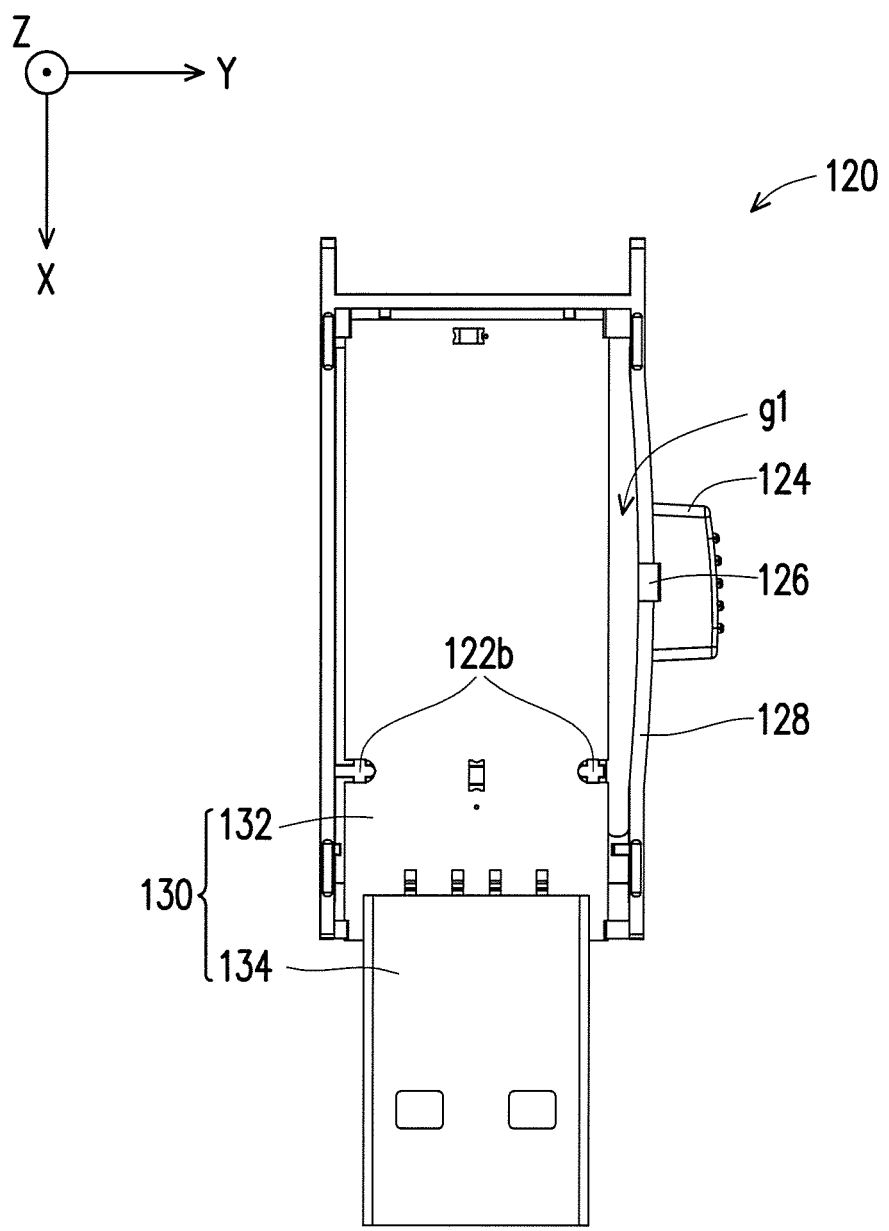
FIG. 4 illustrates a top view of the storage module of FIG. 3 after being combined with the carrier.

FIG. 4 illustrates a top view of the storage module of FIG. 3 after being combined with the carrier. Referring to FIG. 2 to FIG. 4 together, in the present embodiment, when there is no force applied on the elastic arm 128 of the carrier 120 (as shown by FIG. 4), the elastic arm 128 is in a bending state and has a curved contour protruded along a direction away from the storage module 130. Specifically, the carrier 120 of the present embodiment is a tank having a unidirectional opening along the X-axis, and the storage module 130 is engaged with pillars (122a, 122b) protruded from a bottom plate 121 of the tank by the circuit board 132 in order to be assembled into the carrier 120 from the unidirectional opening, such that the connector 134 may extend to outside the tank along the X-axis from the unidirectional opening. Further, the elastic arm 128 is substantially a lateral plate of the tank, which is partially adjacent to the bottom plate 121 while maintaining a gap g1. As shown in FIG. 2 and FIG. 4, two opposite ends of the elastic arm 128 are connected to the bottom plate 121 while the rest of the non-connected parts commonly form the gap g1 together with the bottom plate 121, so that the elastic arm 128 becomes a cantilever structure across two opposite ends of the bottom plate 121. In other words, the elastic arm 128 of the present embodiment may be regarded as one of lateral plates of the tank, which is vertically connected to one side of the bottom plate 121. As shown in FIG. 4, the elastic arm 128 protrudes towards a positive Y-axis direction when not receiving force, and the elastic arm 128 deforms towards a negative Y-axis direction when receiving force. Therefore, when force is applied on the elastic arm 128, the elastic arm 128 approaches towards the bottom plate 121 to reduce the gap g1.

Figure 5:
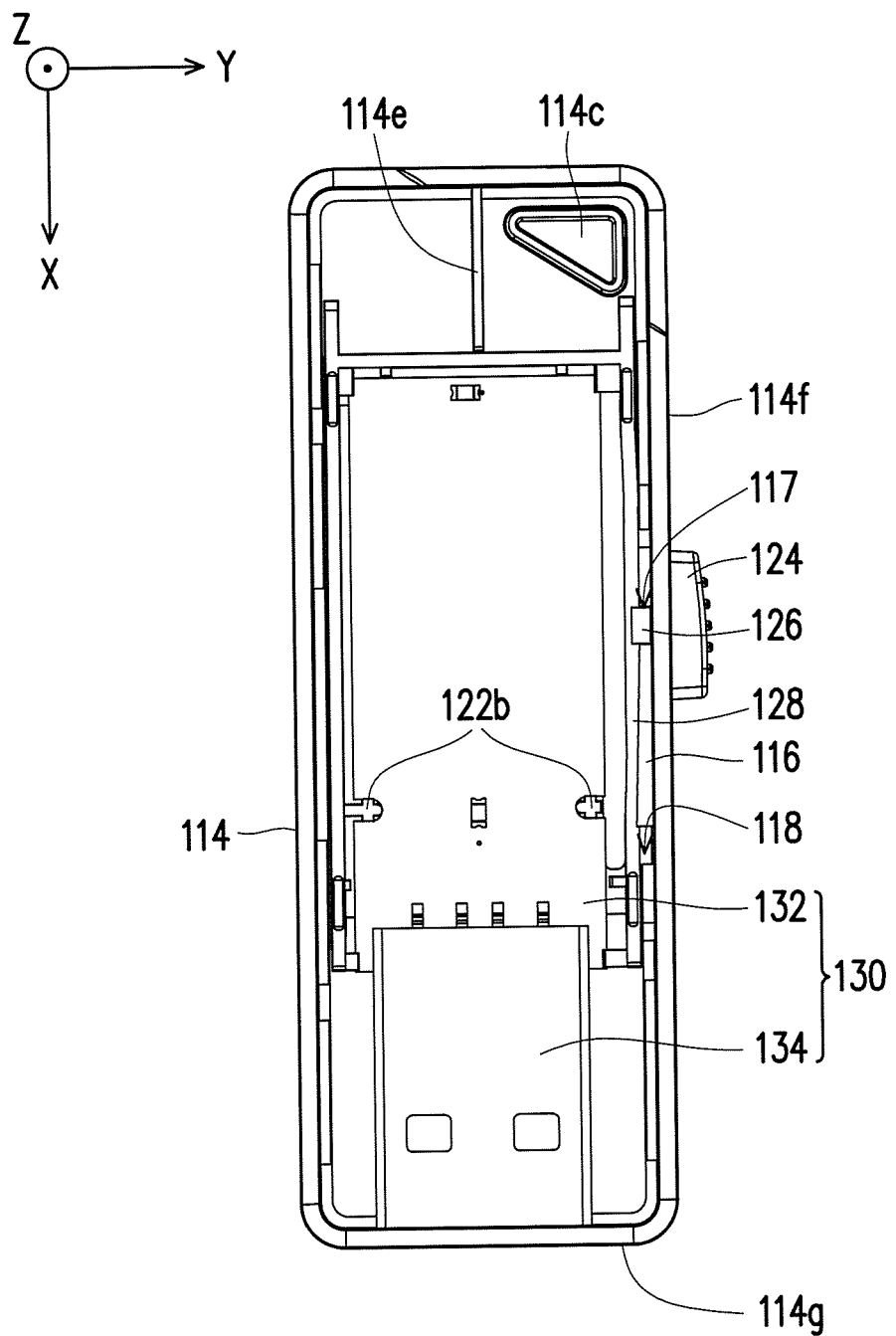
FIG. 5 and FIG. 6 are top views illustrating the flash drive of FIG. 1 respectively in different states.
Figure 6:
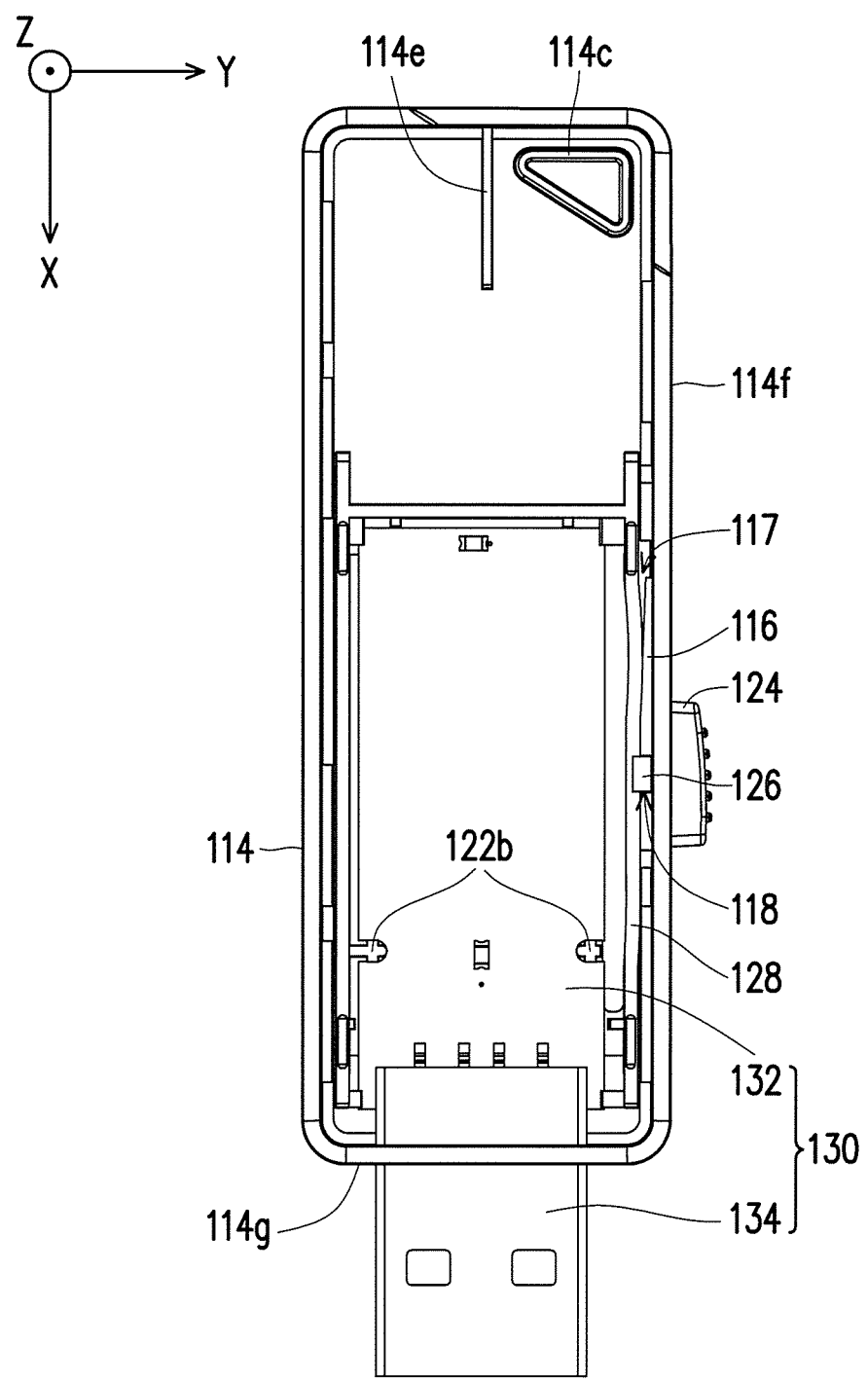

FIG. 5 and FIG. 6 are top views illustrating the flash drive of FIG. 1 respectively in different states. Herein, illustration of the first part 112 of the hosing 110 is omitted in order to clearly recognize the carrier 120 and a motion status of the storage module 130 in the housing 110. As described above, the elastic arm 128 of the carrier 120 protrudes towards the positive Y-axis direction when not receiving force, and a deformable direction of the elastic arm is in the negative Y-axis direction. Therefore, when the carrier 120 is assembled into the second part 114 of the housing 110, the elastic arm 128 is pressed against by the housing 110 to partially deform towards the negative Y-axis direction.

Referring back to FIG. 2 and FIG. 3, in the present embodiment, the second part 114 of the housing 110 further includes sidewalls (114f, 114g) adjacent to each other, the opening 114d is located on the sidewall 114g, and the rib 114b is located on the sidewall 114f. The housing 110 further includes an opening 115 located on the sidewall 114f, and engaging slots (117, 118) and a rib 116 disposed along the X-axis. Herein, the engaging slots (117, 118) and the rib 116 are located on opposite two edges of the opening 115. In the present embodiment, each of the engaging slots 117 and 118 is formed by a pair of concave structures disposed along a Z-axis, and the opening 115 is substantially located between the pair of concave structures.

On the other hand, the carrier 120 further includes a pressing portion 124 and an engaging point 126, which are respectively disposed on the elastic arm 128 and located on one side facing away from the storage module 130 (i.e., facing the positive Y-axis direction). After the carrier 120 is assembled into the second part 114, the elastic arm 128 as well as the pressing portion 124 and the engaging point 126 thereon are corresponding to the sidewall 114f and the opening 115 thereon. In other words, the elastic arm 128 is pushed against the sidewall 114f of the housing 110 at the time to thereby receive force and partially deform towards the negative Y-axis. Also, an elastic force generated by the elastic arm 128 when receiving force can drive the engaging point 126 to be engaged with the engaging slots 117 or 118, or drive the engaging point 126 to push against a portion of the sidewall 114f of the housing 110 located between the engaging slots 117 and 118, that is, the engaging point 126 is practically propped against the rib 116. The pressing portion 124 passes through the opening 115 to protrude outside the sidewall 114f of the housing 110.

Based on the above, in view of FIG. 5 and FIG. 6, when flash drive 100 is not in use, the storage module 130 and the carrier 120 may be completely accommodated inside the housing 110. In this case, the engaging point 126 of the carrier 120 is practically engaged in the engaging slot 117, as shown in FIG. 5. When the flash drive 100 is to be connected to the peripheral device, a user may press on the pressing portion 124 along the Y-axis to make the elastic arm 128 deforming along the negative Y-axis direction so that the engaging point 126 is removed from the engaging slot 117 to push the carrier 120 towards the positive X-axis direction in order to move the connector 134 of the storage module 130 outside the housing 110 through the opening 114d. When the connector 134 has moved outside the housing 110 while the user has stopped applying force on the elastic arm 128 (as shown in FIG. 6), the elastic force of the elastic arm 128 drives the engaging point 126 to be engaged in the engaging slot 118, so that the storage module 130 and carrier 120 are positioned in a state as depicted by FIG. 6. Similarly, when the storage module 130 is to be accommodated, the user applies force again on the pressing portion 124 along the Y-axis (in the negative Y-axis direction) to release the engaging point 126 from the engaging slot 118 and then pushes the carrier 120 to move back into the housing 110 along the negative X-axis direction and push against a stopper 114e. At the time after the user has stopped applying force on the pressing portion 124, the engaging point 126 may return back to be engaged with the engaging slot 117, and the connector 134 is hidden inside the housing 110 once again.

It should be noted that, because the elastic 128 is the curved contour protruded in the positive Y-axis direction when not receiving force, the elastic arm 128 has a more preferable capability of enduring force applied by the user while pressing (towards the negative Y-axis direction). Conversely, because the elastic arm 128 has the sufficient structural strength due to said contour to avoid generation of a contour protruded towards the negative Y-axis (i.e., the so-called indentation) due to deformation, the elastic arm 128 may maintain a preferable engaging relation with the engaging slots 117 and 118 without getting loose from the engaging slots 117 and 118. That is, owing to influence by the protruding contour of the elastic arm 128, the engaging point 126 of the present embodiment is capable of being driven (by the elastic arm 128) to push against the engaging slots 117 and 118.

Besides, on the X-axis, a size (a thickness) of the rib 116 along the Y-axis gradually increases from the engaging slot 117 towards the engaging slot 118 or the opening 114d (i.e., in the positive X-axis direction), resulting in that a sidewall size of the engaging slot 118 (along the Y-axis) is greater than a sidewall size of engaging slot 117 (along the Y-axis). Accordingly, an interference area between the engaging slot 118 and the engaging point 126 may be increased, so as to achieve an effect of positioning without being moved easily when the storage module 130 and the carrier 120 are in the state depicted in FIG. 6. In other words, when the carrier 120 changes its state from FIG. 5 to the state of FIG. 6 (i.e., during the process of moving the engaging point 126 from the engaging slot 117 to the engaging slot 118), as the size of the rib 116 increases (along the Y-axis), force applied (an amount of deformation) on the elastic arm 128 also increases accordingly, such that an interaction force between the elastic arm 128 and the rib 116 along the Y-axis may be further increased to stably position the engaging point 126 inside the engaging slot 118.

It should be additionally noted that, in the present embodiment, the carrier 120 has one pair of the engaging points 126 (as shown in FIG. 3) respectively disposed on upper and lower sides of the pressing portion 124 along the Z-axis, so as to correspond to the engaging slots (117, 118) each formed by disposing the par of concave structure along the Z-axis. In the states depicted in FIG. 5 or FIG. 6, the pair of engaging points 126 are engaged with the pair of concave structures of the engaging slot 117, or engaged with the pair of concave structures of the engaging slot 118. However, the amount of the engaging points is not particularly limited in the invention.

Figure 7:
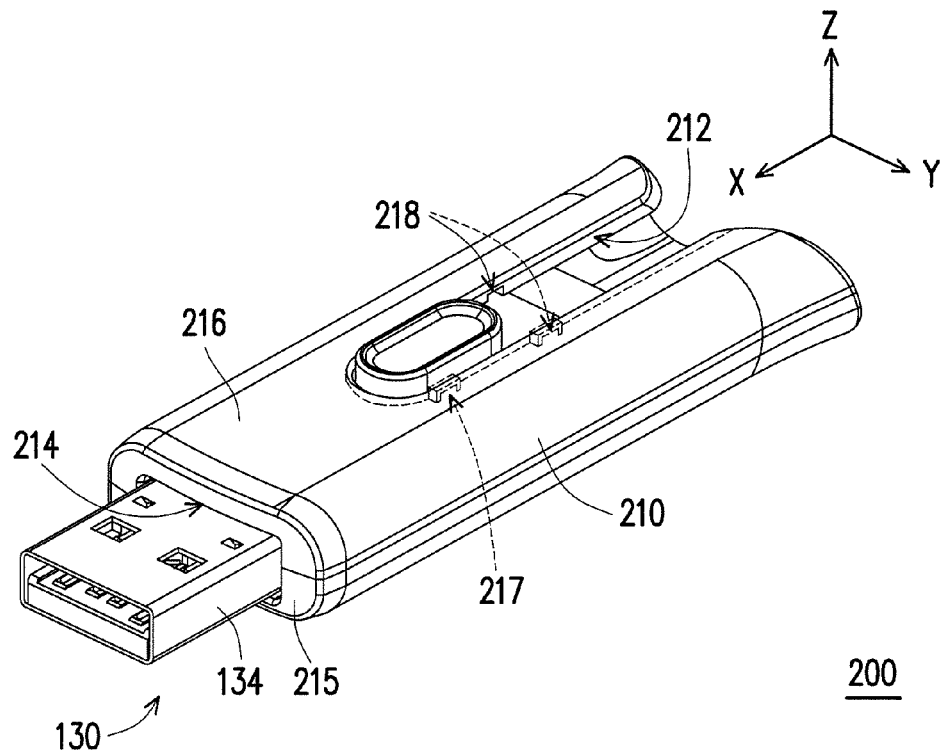
FIG. 7 and FIG. 8 are schematic diagrams respectively illustrating a flash drive in different states according to another exemplary embodiment.
Figure 8:
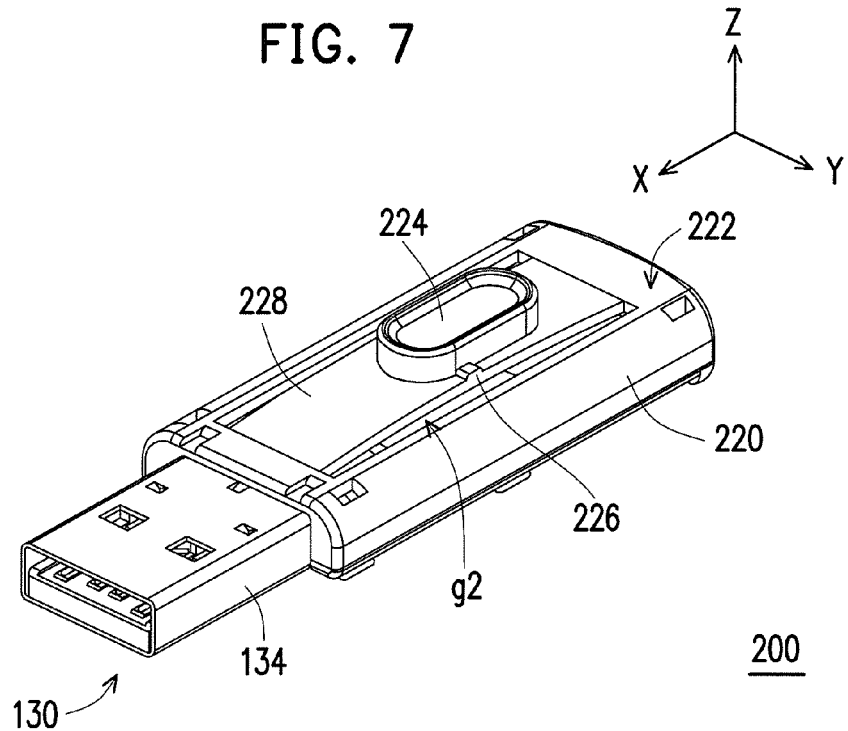

FIG. 7 and FIG. 8 are schematic diagrams respectively illustrating a flash drive in different states according to another exemplary embodiment. Referring to FIG. 7 and FIG. 8 together, unlike the foregoing embodiment, a carrier 220 of a flash drive 200 is a tank, and the storage module 130 is assembled inside the tank so that the connector 134 may be moved outside the carrier 220 along the X-axis. An elastic arm 228 of the carrier 220 is a plate structure, which is located on a top side of the carrier 220 (along the Z-axis) and partially adjacent to a top surface 222 of the carrier 220 while maintaining a gap g2. As shown in FIG. 8, the elastic arm 228 is a cantilever structure across the top surface 222 (where the gap g2 is located between the elastic arm 228 and connection ends of the top surface 222) and has a curved contour protruded along a positive Z-axis direction which is away from the storage module 130. In addition, the carrier 220 further includes a pressing portion 224 located on the elastic arm 228 and engaging points 226 disposed on two opposite sides of the pressing portion 224 along the Y-axis (only one of which is illustrated in the drawing). When the elastic arm 228 is pressed (by a force applied along a negative Z-axis direction), the elastic arm 228 approaches to the top surface 222 to reduce the gap g2.

In the present embodiment, a housing 210 has a top portion 216, a front wall 215, a groove 212 and an opening 214. Herein the top portion 216 is adjacent to the front wall 215, the opening 214 is located on the front wall 215, and the groove 212 is located on the top portion 216 and has a unidirectional opening (towards the negative X-axis direction). The carrier 220 and the storage module 130 therein are assembled into the housing 210 along the groove 212. Meanwhile, the elastic arm 228 is pushed against the top portion 216 of the housing 210, a part of the pressing portion 224 passes through the groove 212 to protrude outside the top portion 216 of the housing 210, and the pressing portion 224 is movably coupled to the groove 212 (along the X-axis).

As similar to the foregoing embodiment, the effect of positioning is achieved by having engaging slots 217 and 218 to be engaged with the engaging points 226 on the elastic arm 228 in the present embodiment. Specifically, after the carrier 220 is assembled into the housing 210, the elastic arm 228 is pressed against by the top portion 216 to partially deform so that the engaging points 226 may thereby engaged together with the engaging slots 217 or 218. The user may apply force on the pressing portion 224 to release the engaging points 226 from engaging slots 217 or 218, so as to continually push the carrier 220 to move back and forth in the housing 210 along the X-axis, such that the connector 134 may be moved outside or hidden inside the housing 210 through the opening 214. In other words, as compared to the foregoing embodiment, the elastic arm 228, the engaging points 226 and the engaging slots 217 and 218 of the present embodiment are all identical to those in foregoing embodiments, and the differences are the position of the elastic arm in relative to the carrier and a combined structure of the carrier and the housing. Also, the motion of the carrier 220 in relative to the housing 210 is identical to that in the foregoing embodiment, which is not repeated hereinafter.

In summary, in the foregoing embodiments of the invention, by providing the elastic arm on one side of the carrier (i.e., forming the cantilever structure having the gap between said side and the remaining parts of the carrier) and providing the elastic arm having the curved contour protruded in the direction away from the storage module (i.e., the positive Y-axis direction or the positive Z-axis direction as described above), such structure can increase the structural strength of the carrier during the process of moving back and forth in the housing in order to resist an inverse deformation (i.e., in the negative Y-axis direction or the negative Z-axis direction as described above), so as to effectively preventing the indentation where the elastic arm bends towards the storage module. By doing so, the carrier may generate the elastic force due to force from an inverse direction (i.e., the negative Y-axis direction or the negative Z-axis direction as descried above), so that the engaging points may effectively be engaged with the engaging slots of the housing to increase an interference force of the carrier when being positioned at the specific position of the housing.

Furthermore, because the rib connected between the engaging slots is also disposed on the opening of the housing and the thickness of the rib gradually increases towards the direction by which the connector moves outside the opening (i.e., when the carrier is pushed to move the connector outside the housing), force applied on the elastic arm of the carrier is also increased. Meanwhile, the rib also cause increases in the thickness of the engaging slots to increase the interference area of the engaging point and the engaging slot. As such, while the connector is moved outside the housing, the sufficient interference force may be provided between engaging point and the engaging slot, so that the flash drive may prevent the condition where the connector is pushed back into the housing due to overly large docking force during the docking process of the connector and the peripheral device.

Although the invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

What is claimed is:

1. A flash drive, comprising:
   a housing;
   a carrier, movably disposed inside the housing along a first axis, wherein the carrier has an elastic arm, and the elastic arm is deformable along a second axis; and
   a storage module, assembled to the carrier and moving together with the carrier in relative to the housing so that a connector of the storage module is moved outside the housing or hidden inside the housing, wherein the elastic arm has a contour protruded along a direction away from the storage module when not receiving force,
   wherein the housing has a pair of engaging slots disposed along the first axis and located on a first sidewall of the housing to correspond to the elastic arm, the pair of engaging slots is located on an edge of the first opening,
   wherein the housing further comprises a rib disposed on the first sidewall and located on the edge of the first opening, wherein the rib is connected between the pair of engaging slots, and
   wherein the rib extends along the first axis, and a thickness of the rib along the second axis gradually increases along the first axis towards the second opening.

2. The flash drive according to claim 1, wherein the elastic arm has a curved contour when not receiving force, and the first axis is orthogonal to the second axis.

3. The flash drive according to claim 1, wherein the elastic arm protrudes towards a first direction of the second axis when not receiving force, and the elastic arm deforms towards a second direction of the second axis when receiving force, wherein the first direction is opposite to the second direction.

4. The flash drive according to claim 3, wherein when the carrier is assembled into the housing, the elastic arm is pressed against by the housing to partially deform towards the second direction.

5. The flash drive according to claim 1, wherein the carrier is a tank with an accommodating space for assembling the storage module, wherein the storage module is assembled inside the tank, and the connector is extended outside the tank along the first axis, wherein the elastic arm is a lateral plate of the tank and partially connected to a bottom plate of the tank while maintaining a gap, and the elastic arm approaches towards the bottom plate to reduce the gap when the elastic arm receives force.

6. The flash drive according to claim 5, wherein two opposite ends of the elastic arm are vertically connected to the bottom plate, and the gap is located between the two opposite ends of the elastic arm.

7. The flash drive according to claim 1, wherein
   the carrier has a pressing portion and at least one engaging point, which are respectively disposed on the elastic arm and located on one side facing away from the storage module;
   wherein when the carrier is assembled into the housing, the elastic arm is pushed against the first sidewall of the housing to receive force, and an elastic force generated by the elastic arm when receiving force drives the engaging point to be engaged with one of the pair of engaging slots or drives the engaging point to push against a portion of the first sidewall of the housing located between the pair of engaging slots.

8. The flash drive according to claim 7, wherein
   the housing has a first opening and a second opening, the first opening is located on the first sidewall, the second opening is located on a second sidewall of the housing, and the first sidewall and the second sidewall are adjacent to each other;
   the pressing portion passes through the first opening to protrude outside the housing, the connector moves together with the carrier to be moved outside the housing or hidden inside the housing through the second opening, and the pressing portion is adapted to be pressed along the second axis so that the engaging point is accommodated in one of the engaging slots or released from the engaging slot.

9. The flash drive according to claim 8, wherein the carrier has a pair of engaging points, wherein the pair of engaging points are disposed on two opposite sides of the pressing portion along a third axis, and each of the engaging slots is formed by a pair of concave structures, wherein the concave structures are disposed along the third axis, and wherein the first opening is located between the pair of concave structures, the pair of concave structures are corresponding to the pair of engaging points, and the third axis is orthogonal to the first axis and the second axis.

10. The flash drive according to claim 1, wherein the carrier is a tank, wherein the storage module is assembled inside the tank, and the connector is extended outside the tank along the first axis, wherein the elastic arm is a plate structure partially adjacent to a top surface of the tank while maintaining a gap, the gap is located between the elastic arm and the top surface, wherein the elastic arm approaches towards the top surface to reduce the gap when receiving force.

11. The flash drive according to claim 10, wherein the elastic arm is connected to the top surface along two opposite ends of the first axis, and the gap is located between two opposite ends of the elastic arm.

12. The flash drive according to claim 1, wherein a top portion of the housing has a pair of engaging slots disposed along the first axis to correspond to the elastic arm, and the carrier has a pressing portion and at least one engaging point, respectively disposed on the elastic arm and located on one side facing away from the storage module, wherein when the carrier is assembled into the housing, the elastic arm is pushed against the top portion of the housing to receive force, and an elastic force generated by the elastic arm when receiving force drives the engaging point to be engaged with one of the pair of engaging slots or drives the engaging point to push against a portion of the top portion of the housing located between the pair of engaging slots.

13. The flash drive according to claim 12, wherein the housing has a groove located on the top portion, the pair of engaging slots is located on an edge of the groove, a part of the pressing portion passes through the groove to protrude outside the housing, and the pressing portion is adapted to be pressed along the second axis so that the engaging point is accommodated in one of the engaging slots or released from the engaging slot.

* * * * *